United States Patent
Coffa et al.

(10) Patent No.: US 6,743,654 B2
(45) Date of Patent: Jun. 1, 2004

(54) METHOD OF FABRICATING PRESSURE SENSOR MONOLITHICALLY INTEGRATED

(75) Inventors: Salvatore Coffa, Tremestieri Etneo (IT); Luigi Occhipinti, Ragusa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/014,880

(22) Filed: Dec. 11, 2001

(65) Prior Publication Data
US 2002/0151100 A1 Oct. 17, 2002

(30) Foreign Application Priority Data
Dec. 15, 2000 (IT) .................................. VA2000A0042

(51) Int. Cl.$^7$ ................................................ H01L 21/00
(52) U.S. Cl. ........................... 438/52; 438/53; 257/415; 257/416
(58) Field of Search ...................... 438/50–53, 106, 438/109, 48; 257/415, 419, 417, 421

(56) References Cited

U.S. PATENT DOCUMENTS

| | | | |
|---|---|---|---|
| 5,573,679 A | | 11/1996 | Mitchell et al. ............... 216/2 |
| 5,659,195 A | | 8/1997 | Kaiser et al. ................ 257/415 |
| 5,665,250 A | * | 9/1997 | Iwata et al. .................... 438/52 |
| 5,725,729 A | | 3/1998 | Greiff ........................ 156/657.1 |
| 6,472,244 B1 | * | 10/2002 | Ferrari et al. ................. 438/53 |

FOREIGN PATENT DOCUMENTS

EP 0822398 2/1998 ............. G01L/9/06

* cited by examiner

Primary Examiner—Dung A. Le
(74) Attorney, Agent, or Firm—Lisa K. Jorgenson; Allen, Dyer, Doppelt, Milbrath & Gilchrist, P.A.

(57) ABSTRACT

A method of making a monolithically integrated pressure sensor includes making a cavity in the semiconductor substrate. This may be formed by plasma etching the front side or the back side of the silicon wafer to cut a plurality of trenches or holes deep enough to extend for at least part of its thickness into a doped buried layer of opposite type of conductivity of the substrate and of the epitaxial layer grown over it. The method may also include electrochemically etching through such trenches, and the silicon of the buried layer with an electrolytic solution suitable for selectively etching the doped silicon of the opposite type of conductivity, thereby making the silicon of the buried layer porous. The method may also include oxidizing and leaching away the silicon so made porous.

24 Claims, 4 Drawing Sheets

METHOD OF FABRICATING PRESSURE SENSOR MONOLITHICALLY INTEGRATED

FIELD OF THE INVENTION

The present invention relates in general to pressure sensors, and, in particular, to an integrated pressure sensor and a related process of fabrication using surface micromachining.

BACKGROUND OF THE INVENTION

Pressure sensors are used in several applications, particularly in processes of active noise cancellation, and especially in distributed parameter systems, such as an airplane cabin or the interior of a vehicle. Semiconductor pressure sensors are widely used for these purposes. Their sensing element is a vibrating silicon diaphragm topped by a spaced backplate layer provided with a plurality of openings and formed of polycrystalline silicon (polysilicon or briefly "poly"), both disposed over a microphone cavity.

These pressure sensors are constructed starting from a semiconductor structure obtained by defining the area of the pressure sensor and implanting a dopant to form a doped layer of a certain type in a monocrystalline silicon substrate of doping type opposite to that of the doped layer that is finally created as a doped buried layer upon growing an epitaxial layer of the same type of doping of the substrate thereon. The epitaxial layer in the area of the sensor will eventually become the diaphragm of the sensor.

By etching from the substrate, that is etching the substrate from the back side thereof to reach the buried doped layer, the latter is uncovered and thereafter selectively etched to leave a microphone diaphragm provided by the epitaxial layer overhanging a so-realized cavity (microphone cavity). This known technique requires that the mask or masks used to carry out the etchings on the back side of the substrate must be perfectly aligned with the masks that are normally used on the front side of the semiconductor wafer for realizing a suitable backplate structure of the pressure sensor above the diaphragm.

This is an unavoidable drawback because of the special equipment that is needed, the relative poor precision of alignment that can be achieved, and the relative high costs. Moreover, the selective chemical etching of the buried doped silicon layer is typically carried out at a relatively high temperature (in the range of 85–90° C.), typically using an aqueous solution of potassium hydroxide KOH, to achieve a sufficiently fast etching rate.

A further drawback of the known process is that the etching rate (microns of material removed per minute) in a direction normal to the plane of the substrate is typically 0.3 $\mu$m/min, while the speed of the etching in a direction parallel to the plane of the substrate is about 0.03 $\mu$m/min, that is ten times smaller. This produces a typically V-shaped groove 12, as depicted in FIG. 1. The V-shaped groove 12 is formed in the silicon substrate 11 using the masking layer 15 to form the membrane area 13 of the membrane layer 14 over the groove.

Such a V-shaped cross section of the microphone cavity may be observed in known semiconductor microphones of different kind, such as those depicted in FIGS. 2a–2d, whether they are piezoresistive (FIG. 2a), piezoelectric (FIG. 2b), capacitive (FIG. 2c) or optically read (FIG. 2d). This represents a tolerated, but far from optimal, shape because of the non-uniformity of pressure wave reactions over the microphone sensing area.

The rear of the microphone cavity is successively closed by the so called "wafer bonding" technique. In other words, the sensor is bonded onto a flat silicon wafer, in which the associated circuitry may be integrated.

A method for realizing integrated CMOS structures by first realizing portions of circuits on a separate wafer and thereafter carrying out a wafer bonding, is described in the U.S. Pat. No. 5,659,195. In practice, the above described known process, which is relatively complicated by the wafer bonding step, does not provide for a monolithically integratable pressure sensor. Moreover, it is not possible to vary the depth of the microphone cavity that is predetermined by the thickness of the substrate.

SUMMARY OF THE INVENTION

It has been found and is the object of the invention a process for realizing pressure sensors monolithically integratable together with a semiconductor integrated circuit on the same chip, and which overcomes the above mentioned limits and drawbacks of prior art techniques.

According to the present invention, monolithically integrated pressure sensors of outstanding quality and versatility are produced through micromechanical surface structure definition techniques typical of MEMS (MicroElectroMechanical Systems). More precisely, the object of the invention is a process of fabrication of a pressure sensor that may comprise forming in a monocrystalline silicon substrate of a certain type of conductivity a buried layer of opposite type of conductivity upon growing an epitaxial layer of the same type of conductivity of the substrate. The method may also include forming a sacrificial layer of oxide over the epitaxial layer, forming a polysilicon backplate layer with a plurality of holes above the area of the sensor on the sacrifical oxide layer, and chemically etching the sacrifical oxide layer through the holes of the polysilicon backplate layer thereby removing the sacrificial oxide in the sensor area. In addition, the method may include forming a microphone cavity in the sensor area under the epitaxial layer diaphragm by selectively etching the doped silicon of the buried layer.

Differently from the known processes, according to this invention a microphone cavity in the semiconductor substrate may be monolithically formed by carrying out the following steps before forming the sacrifical oxide layer:

1) cutting by plasma etching the front side or the back side of the silicon wafer to form a plurality of trenches or holes deep enough to extend for at least part of its thickness into the buried layer to be selectively etched;

2) electrochemically etching through such trenches the silicon of the buried layer with an electrolytic solution suitable for selectively etching the doped silicon of the opposite type of conductivity, thereby making the silicon of the buried layer porous; and 3) oxidizing and leaching away the silicon so made porous.

Narrow trenches or holes, reaching into the buried layer are realized in the first step, while in the second step the silicon of the buried layer is rendered highly porous. The so made porous silicon may be then easily oxidized and a final chemical etching of the oxidized silicon may be carried out at significantly lower temperatures than those that are normally required by prior art techniques based on the selective etching of the doped monocrystalline silicon. The trenches or holes for accessing the doped buried layer may even be cut through the epitaxial layer and not through the rear of the monocrystalline silicon substrate. This may avoid the burden of precisely aligning the mask on the rear surface with the masks that are used on the front surface of the substrate. Moreover, the thickness of the substrate is normally greater than that of the epitaxial layer. Thus, the need to cut relatively deep and narrow trenches requiring the use of special plasma etching equipment may be avoided.

Optionally, the porous silicon of the buried layer may be oxidized immediately after having performed the selective electrochemical etching or it may be oxidized later in the process, after having deposited the polysilicon layer of backplate.

A further advantage of the present invention is to provide pressure sensors with a cavity that may be wholly defined in a monolithic semiconducting substrate and whose shape and dimensions may be freely established and with a diaphragm that may be shaped in any desired manner leaving to the designer an unrestrained choice of layout.

A further advantage of the invention is that of allowing the realization of a monolithically integrated system for detecting the direction of the source of a sound wave, and capable of exploiting to this end an array of integrated pressure sensors of the invention disposed according to a certain layout.

BRIEF DESCRIPTION OF THE DRAWINGS

The different aspects and advantages of the invention will become even more evident through a detailed description of an embodiment of the invention and by referring to the attached drawings, wherein.

DETAILED DESCRIPTION OF THE PREFERRED EMBODIMENTS

With the process of this invention, the fundamental steps of which are schematically illustrated in FIGS. 3a–3h, a monolithically integrated pressure sensor is constructed by surface micromachining techniques using a relatively low temperature etching of the doped monocrystalline silicon.

First, in the defined sensor area, a buried layer 21 of doping of opposite type of conductivity is realized in a doped monocrystalline silicon substrate 20 upon growing thereon of a doped epitaxial layer 22 of the same type of conductivity as the substrate.

Figure 1:
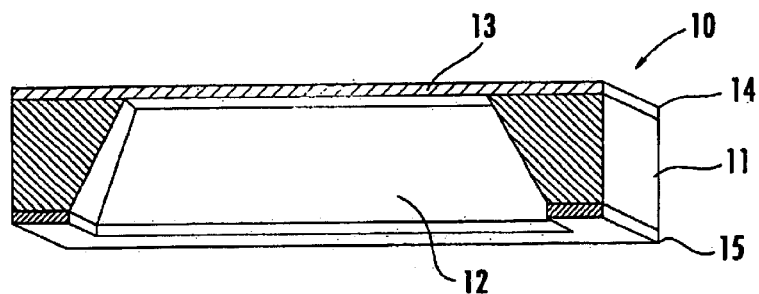
FIG. 1 is schematic perspective view of a portion of a monolithic substrate with an integrated diaphragm realized using the known technique of etching the substrate from the back as in the prior art.
Figure 2A:
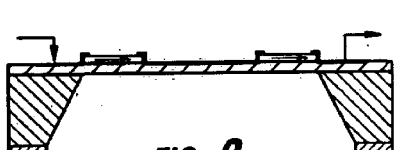
FIGS. 2a–2d are schematic cross-sectional views of pressure sensors of different types realized by etching the substrate from the back as in the prior art.
Figure 2B:
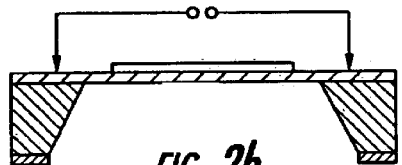
Figure 2C:
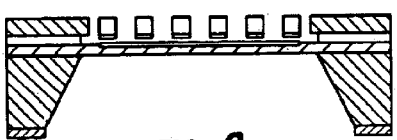
Figure 2D:
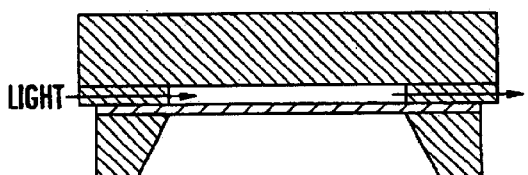
Figure 3B:
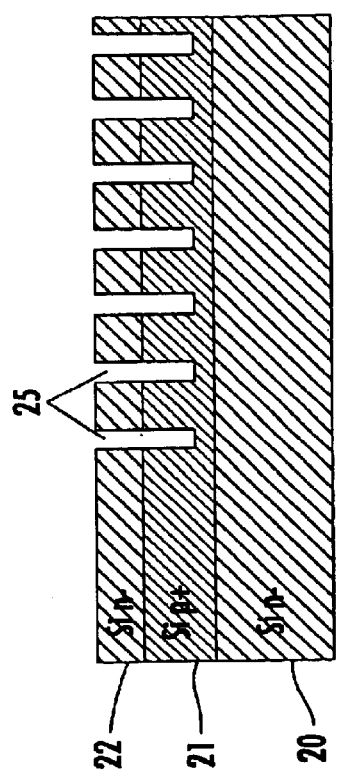
FIGS. 3a–3h are schematic cross-sectional views illustrating different steps of the process of the invention.
Figure 3D:
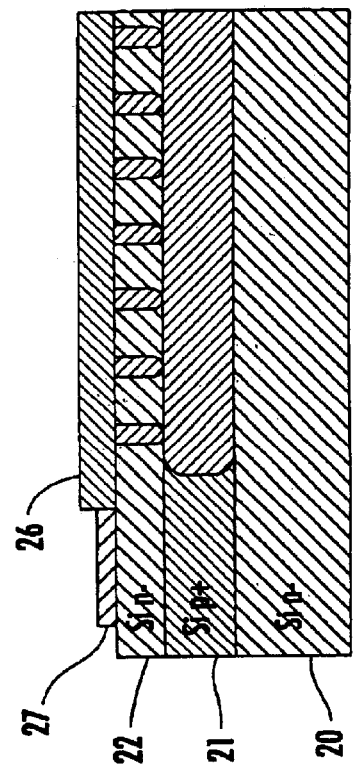
Figure 3A:
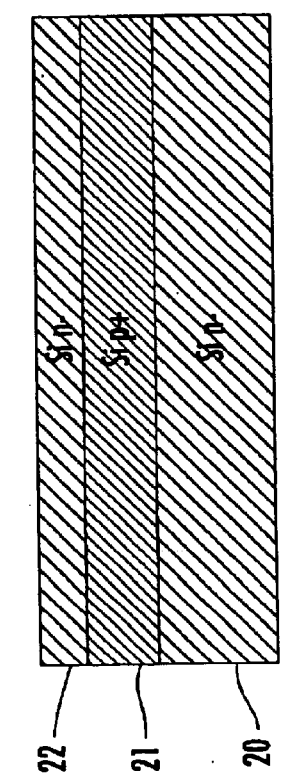

In the example illustrated in FIG. 3a, the buried layer 21 has a P+ doping while the substrate 26 and the epitaxial layer 22 are both N− doped. The invention may be practiced by inverting the types of doping. The buried layer 21 may be 5 to 10 µm thick, and the epitaxial layer 22 may be about 1 µm thick.

According to the embodiment shown by way of example in FIG. 3b, a plurality of narrow and deep trenches 25 are cut through the epitaxial layer 22 and through part of the thickness of the previously formed buried layer 21 by masking and anisotropically plasma etching. The width of the trenches may be in the range of 3 to 6 µm and the spacing may be 100 µm.

According to this preferred embodiment, the trenches 25 are cut by plasma etching starting from the front of the wafer thus facilitating mask alignment. The trenches 25 cut from the front of the wafer through the epitaxial layer 22 that will ultimately become the diaphragm of dynamic pressure sensor (pressure wave sensor) should be wide enough to permit electrochemical etching of the silicon of the doped buried layer 21 and the subsequent oxidation of the porous silicon and its chemical leaching away to thereby permit a relief for the air from the microphone cavity when the diaphragm flexes inwardly under the effect of the crest of a pressure wave.

Overall, the size and distribution of the trenches or holes 25 through the epitaxial layer 22 (diaphragm of the sensor) should desirably be designed, on account of the thickness of the layer, such as to confer on the diaphragm the desired characteristics of flexibility, sturdiness and vibrational modes. In any case, these narrow trenches 25 may be made deep enough to extend for at least a portion of a thickness into the buried layer 21.

Figure 3C:
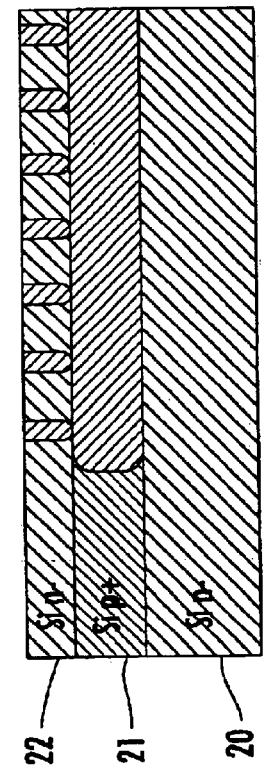

The doped silicon buried layer 21 is selectively etched electrochemically using an electrolytic solution suited to selectively or preferentially dissolve the P+ doped silicon, making the silicon of the buried layer 21 porous as shown in FIG. 3c. Preferably an aqueous solution of hydrofluoric acid (HF) is used.

Thereafter, the trenches sealed by depositing a silicon oxide layer, or sealant layer, by a PVAPOX process and the surface is planarized according to common techniques to produce the structure of FIG. 3c. On the so planarizod surface a backplate structure of the sensor is formed according to the known technique of first depositing by a PVAPOX process a layer of sacrificial oxide 26 over the sensor area followed by the deposition of a contouring layer of silicon nitride 27 around the perimeter sacrificial oxide layer (FIG. 3d). Finally, a layer of polycrystalline silicon 28 of the backplate is deposited with a plurality of holes 30 over the sacrificial oxide layer 26 and over the perametral layer of silicon nitride 27 as shown in FIG. 3a.

The backplate of polysilicon 28 should be pervious to pressure waves through its plurality of uniformly spaced holes 30 in order to allow a correct action of the pressure wave on the diaphragm provided by the epitaxial layer 22. The backplate should desirably be sufficiently spaced to accommodate an unrestrained maximum deflection of the diaphragm according to the established dynamic range thereof. Normally the gap between the diaphragm and the backplate or grid may be of about 1 µm. Moreover, the polysilicon backplate should have a conductivity sufficient to act as second plate of a capacitor, a first plate of which is provided by the vibrating diaphragm itself.

According to the embodiment shown, the polysilicon backplate may be n+ doped and may rest on the perimetral isolation layer of silicon nitride 27. Optionally, a second layer of undoped polysilicon may be deposited over the n+ doped layer (conductive plate) for mechanical protection and electrical isolation purposes.

Figure 3F:
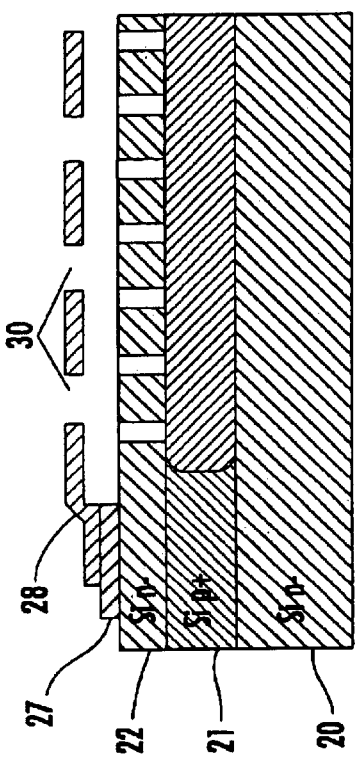
Figure 3H:
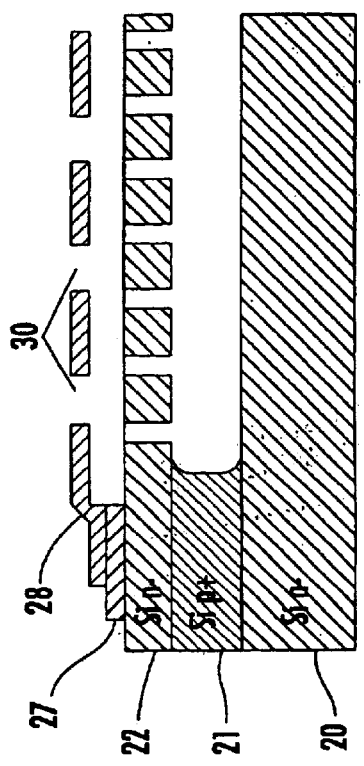
Figure 3E:
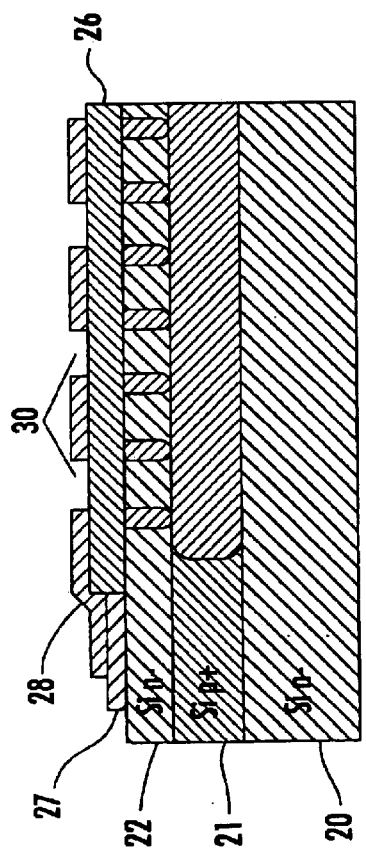
Figure 3G:
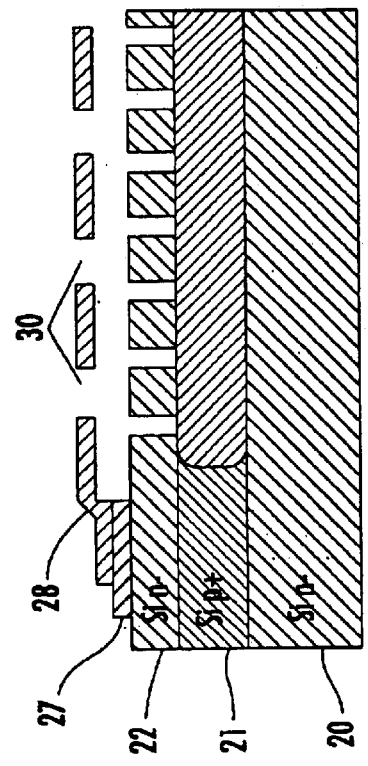

The layer of sacrifical oxide 26 is then removed by isotropic chemical etching through the holes 30 of the polysilicon backplate layer 28, that will rest on the perimetral supporting layer of silicon nitride 27. Finally, a microphone cavity is realized by chemically etching off the PVAPOX silicon oxide that sealed the trenches as shown in FIG. 3f, and by thermally oxidizing the porous silicon of the buried layer and leaching it away chemically through the re-opened trenches as shown in FIGS. 3g and 3h.

Optionally, the porous silicon of the buried layer 21 may be oxidized immediately after having rendered porous by the selective electrochemical etching and continuing the process by sealing the trenches, planarizing the surface and forming the backplate structure of polysilicon.

Contrary to the sensors of the CMOS device described in the U.S. Pat. No. 5,659,195, wherein the microphone cavity is closed by "wafer bonding" technique, the pressure sensors of this invention are entirely made in a monolithic form. The depth of the microphone cavity of the pressure sensor of this invention may be established simply by varying the thickness of the doped buried layer 21 to be eventually etched away.

According to the process of the invention, the microphone cavity is realized by dissolving the oxidized porous silicon (that is the oxide). This is a processing step that may be safely performed at room temperature using a diluted solution of hydrofluoric acid. By contrast, the known processes rely on a chemical etching of the monocrystalline silicon of the substrate that must be carried out at a temperature of at least about 85–90° C. because of the unacceptably low rate of the etching at room temperature of monocrystalline silicon.

Figure 4:
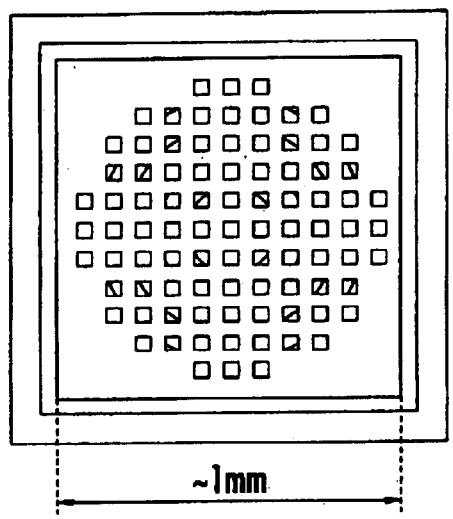
FIG. 4 is a plan view of an integrated pressure sensor of the invention.

The diaphragm of the pressure sensor provided by the epitaxial layer overhanging the microphone cavity formed with the method of this invention may have any shape. For example, it may be in the form of concentric circular sectors, each 100 $\mu$m wide, as depicted in FIG. 4.

The pressure sensor of the invention may be easily integrated using common processing techniques by carrying out a sequence of process steps for selectively making porous the silicon of the doped buried layer, after which common processing steps may follow (for instance according to a standard CMOS process), for realizing the circuitry with which the pressure sensor will interact.

Figure 5:
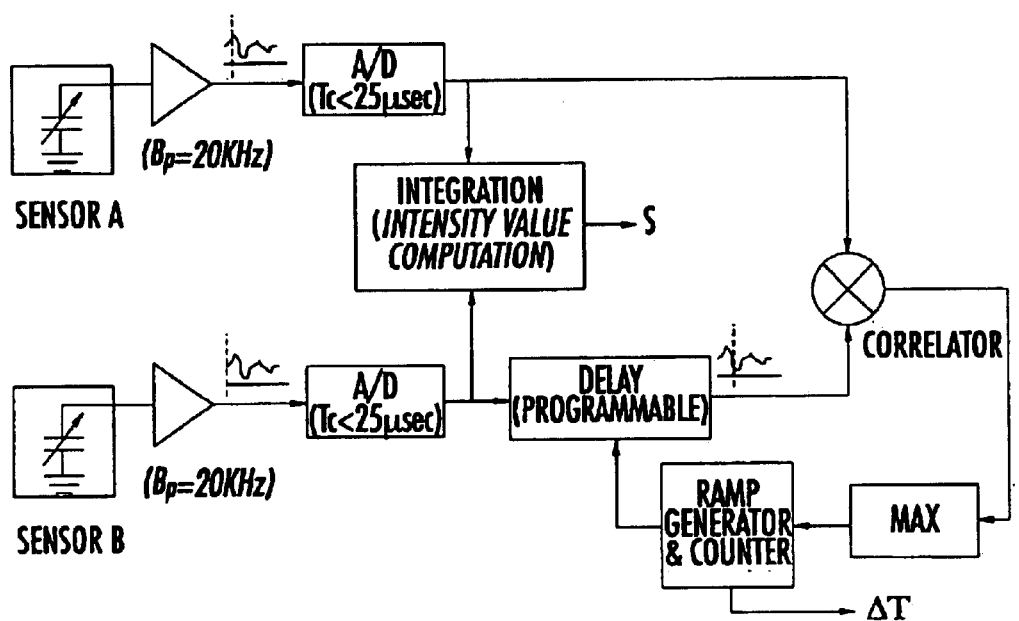
FIG. 5 is a schematic circuit diagram of an integrated system for sensing the direction of the source for a sound wave in accordance with the invention.

A further object of the invention is that of providing a monolithically integrated system, as the one depicted in FIG. 5, for sensing the direction of the source of a sound wave and its intensity by analyzing the signals produced by an array of monolithically integrated pressure sensors of the invention, disposed at different locations of the same chip, and using the circuit blocks schematically shown in FIG. 5.

The distinct pressure sensors of the system, which in the embodiment of FIG. 5 are only two but which may be even more numerous, will produce at different instants an electrical signal representative of the vibration induced on their diaphragm. The direction of the, source of a sound wave as sensed by the various pressure sensors of the integrated system of the invention is determined on the basis of the relative delays with which distinct sensors detect the sound wave.

This may be implemented by carrying out a time-delay correlation between the signal produced by a first sensor and the signal produced by any other sensor present in the integrated device and calculating for which delays the correlations are at their maximum. Each of these delays will represent the difference between the times needed by the sound wave to reach the respective sensor. Knowing the relative positions of the various sensors, it is possible to evaluate by triangulation the direction of the source of the sound wave.

That which is claimed is:

1. A process of fabricating a pressure sensor comprising:
   forming a buried layer of second conductivity type in a substrate of first conductivity type and forming an upper layer of first conductivity type adjacent the buried layer;
   forming at least one opening to a depth sufficient to reach the buried layer;
   selectively etching the buried layer through the at least one opening to make the buried layer porous;
   forming a sacrificial layer on the upper layer;
   forming a backplate over the sacrificial layer; and
   removing the sacrificial layer and porous buried layer to thereby define a cavity and adjacent diaphragm for the pressure sensor.

2. A process according to claim 1 further comprising forming a plurality of holes in the backplate.

3. A process according to claim 1 wherein the cavity and adjacent diaphragm are shaped as concentric circular sectors.

4. A process according to claim 1 further comprising forming a sealant layer for the at least one opening prior to forming the sacrificial layer; and etching the sealant layer to reopen the at least one opening before the removing.

5. A process according to claim 4 wherein the sealant layer and the sacrificial layer both comprise silicon oxide deposited by a PVAPOX technique.

6. A process according to claim 1 wherein the removing comprises oxidizing the porous buried layer and etching the oxidized porous buried layer.

7. A process according to claim 6 wherein the oxidizing is carried out immediately after selectively etching the buried layer.

8. A process according to claim 6 wherein the etching comprises isotropically etching with an acid solution.

9. A process according to claim 8 wherein the acid solution comprises a diluted solution of hydrofluoric acid and the etching is carried out at room temperature.

10. A process according to claim 1 wherein the substrate comprises monocrystalline silicon; and wherein forming the backplate comprises forming the backplate of polycrystalline silicon.

11. A process according to claim 1 wherein selectively etching the buried layer comprises electrochemically etching the buried layer using an electrolytic solution.

12. A process according to claim 1 wherein forming the at least one opening comprises forming a plurality of openings equally spaced apart.

13. A process according to claim 1 wherein forming the at least one opening comprises forming the at least one opening by making and anisotropic plasma etching.

14. A process according to claim 1 wherein forming the at least one opening comprises forming the at least one opening through a face of the substrate opposite the upper layer.

15. A process according to claim 1 wherein forming the at least one opening comprises forming the at least one opening through a face of the upper layer opposite the substrate.

16. A process according to claim 1 wherein the substrate comprises monocrystalline silicon and the upper layer comprises an epitaxial silicon layer.

17. A process of fabricating a pressure sensor comprising:
   forming a buried layer of second conductivity type between first and second layers of first conductivity type;
   forming at least one opening to a depth sufficient to reach the buried layer;
   selectively treating the buried layer through the at least one opening;

forming a sealant layer on the at least one opening;

forming a sacrificial layer adjacent the upper layer and sealant layer;

forming a backplate over the sacrificial layer with a plurality of holes therein;

etching the sealant layer to reopen the at least one opening; and removing the sacrificial layer and the treated buried layer to thereby define a cavity and adjacent diaphragm for the pressure sensor.

18. A process according to claim 17 wherein the cavity and adjacent diaphragm are shaped as concentric circular sectors.

19. A process according to claim 17 wherein removing comprises oxidizing the treated buried layer and etching the oxidized treated buried layer.

20. A process according to claim 19 wherein the oxidizing is carried out immediately after selectively treating the buried layer.

21. A process according to claim 19 wherein the etching comprises isotropically etching with an acid solution carried out at room temperature.

22. A process according to claim 17 wherein the substrate comprises monocrystalline silicon; and wherein forming the backplate comprises forming the backplate comprising polycrystalline silicon.

23. A process according to claim 17 wherein selectively treating the buried layer comprises electrochemically etching the buried layer using an electrolytic solution.

24. A process according to claim 17 wherein the first layer comprises a substrate and the second layer comprises an epitaxial layer formed thereon; and wherein forming the at least one opening comprises forming the at least one opening through the epitaxial layer.

* * * * *

UNITED STATES PATENT AND TRADEMARK OFFICE
CERTIFICATE OF CORRECTION

PATENT NO. : 6,743,654 B2
DATED : June 1, 2004
INVENTOR(S) : Coffa et al.

It is certified that error appears in the above-identified patent and that said Letters Patent is hereby corrected as shown below:

Column 4,
Line 31, delete "trenches sealed" insert -- trenches are sealed --
Line 34, delete "planarizod" insert -- planarized --
Line 40, delete "polycrystailine" insert -- polycrystalline --
Line 42, delete "perametral" insert -- perimetral --
Line 43, delete "3a" insert -- 3e --

Column 5,
Line 52, delete "the, source" insert -- the source --

Column 6,
Line 50, delete "making" insert -- masking --

Column 7,
Line 1, delete "layer on" insert -- layer for --

Signed and Sealed this

Twenty-first Day of December, 2004

JON W. DUDAS
*Director of the United States Patent and Trademark Office*